(12) United States Patent
Yang et al.

(10) Patent No.: US 9,214,959 B2
(45) Date of Patent: Dec. 15, 2015

(54) SYSTEMS AND METHODS FOR SKIP LAYER DATA DECODING

(71) Applicant: LSI Corporation, San Jose, CA (US)

(72) Inventors: Shaohua Yang, San Jose, CA (US); Fan Zhang, Milpitas, CA (US); Chung-Li Wang, San Jose, CA (US); Shu Li, San Jose, CA (US)

(73) Assignee: Avago Technologies General IP (Singapore) pte. Ltd., Singapore (SG)

( * ) Notice: Subject to any disclaimer, the term of this patent is extended or adjusted under 35 U.S.C. 154(b) by 258 days.

(21) Appl. No.: 13/770,008

(22) Filed: Feb. 19, 2013

(65) Prior Publication Data

US 2014/0237314 A1  Aug. 21, 2014

(51) Int. Cl.
 H03M 13/00 (2006.01)
 H03M 13/11 (2006.01)
 G11B 20/18 (2006.01)
(52) U.S. Cl.
 CPC ....... H03M 13/1122 (2013.01); G11B 20/1833 (2013.01); H03M 13/114 (2013.01); H03M 13/1128 (2013.01); H03M 13/1142 (2013.01); H03M 13/6331 (2013.01); H03M 13/6343 (2013.01); H03M 13/658 (2013.01)
(58) Field of Classification Search
 USPC ........................................................ 714/752
 See application file for complete search history.

(56) References Cited

U.S. PATENT DOCUMENTS

| | | | |
|---|---|---|---|
| 4,553,221 A | 11/1985 | Hyatt | |
| 4,805,174 A | 2/1989 | Kubot | |
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,351,274 A | 9/1994 | Chennakeshu | |
| 5,392,299 A | 2/1995 | Rhines | |
| 5,406,593 A | 4/1995 | Chennakeshu | |
| 5,417,500 A | 5/1995 | Martinie | |
| 5,450,253 A | 9/1995 | Seki | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,696,504 A | 12/1997 | Oliveros | |
| 5,710,784 A | 1/1998 | Kindred | |

(Continued)

FOREIGN PATENT DOCUMENTS

| | | |
|---|---|---|
| JP | 2001/319433 A | 11/2001 |
| WO | WO 2010/059264 A1 | 5/2010 |
| WO | WO 2010/126482 A1 | 11/2010 |

OTHER PUBLICATIONS

U.S. Appl. No. 13/426,714, filed Mar. 22, 2012, Shaohua Yang.

(Continued)

Primary Examiner — April Y Blair
Assistant Examiner — Thien D Nguyen

(57) ABSTRACT

The present inventions are related to systems and methods for data processing, and more particularly to systems and methods for performing data decoding including skipping one or more codeword blocks in the data decoding process. In one embodiment a data processing system includes a skip control circuit operable to skip re-application of a data decode algorithm to a portion of a codeword where at least the number of unsatisfied checks for the portion is zero.

18 Claims, 6 Drawing Sheets

(56) References Cited

U.S. PATENT DOCUMENTS

| | | |
|---|---|---|
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,697,441 B1 | 2/2004 | Bottomley |
| 6,748,034 B2 | 6/2004 | Hattori |
| 6,757,862 B1 | 6/2004 | Marianetti, II |
| 6,785,863 B2 | 8/2004 | Blankenship |
| 6,807,238 B1 | 10/2004 | Rhee |
| 6,810,502 B2 | 10/2004 | Eidson |
| 6,839,774 B1 | 1/2005 | Ahn et al. |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,957,251 B2 | 6/2011 | Ratnakar Aravind |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,161,361 B1 | 4/2012 | Song et al. |
| 8,201,051 B2 | 6/2012 | Tan |
| 8,225,168 B2 | 7/2012 | Yu et al. |
| 8,237,597 B2 | 8/2012 | Liu |
| 8,255,765 B1 | 8/2012 | Yeo |
| 8,261,171 B2 | 9/2012 | Annampedu |
| 8,291,284 B2 | 10/2012 | Savin |
| 8,291,299 B2 | 10/2012 | Ii |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,464,142 B2 | 6/2013 | Gunnam |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2007/0121464 A1* | 5/2007 | He ............. 369/59.23 |
| 2007/0234178 A1 | 10/2007 | Richardson |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0273492 A1 | 11/2009 | Yang et al. |
| 2010/0077276 A1 | 3/2010 | Okamura et al. |
| 2010/0088575 A1 | 4/2010 | Sharon et al. |
| 2010/0150252 A1 | 6/2010 | Camp |
| 2010/0172046 A1 | 7/2010 | Liu et al. |
| 2010/0241921 A1 | 9/2010 | Gunam |
| 2010/0268996 A1 | 10/2010 | Yang |
| 2010/0322048 A1 | 12/2010 | Yang et al. |
| 2010/0325511 A1 | 12/2010 | Oh |
| 2011/0041040 A1 | 2/2011 | Su |
| 2011/0043938 A1 | 2/2011 | Mathew |
| 2011/0154170 A1* | 6/2011 | Challa et al. ............ 714/807 |
| 2011/0167227 A1 | 7/2011 | Yang |
| 2011/0258508 A1* | 10/2011 | Ivkovic et al. ............ 714/752 |
| 2011/0264987 A1 | 10/2011 | Li |
| 2011/0307760 A1 | 12/2011 | Pisek |
| 2011/0320902 A1* | 12/2011 | Gunnam ............ 714/752 |
| 2012/0020402 A1 | 1/2012 | Ibing |
| 2012/0038998 A1 | 2/2012 | Mathew |
| 2012/0063023 A1 | 3/2012 | Mathew |
| 2012/0079353 A1 | 3/2012 | Liikanen |
| 2012/0124118 A1 | 5/2012 | Ivkovic |
| 2012/0182643 A1 | 7/2012 | Zhang |
| 2012/0185744 A1 | 7/2012 | Varnica |
| 2012/0207201 A1 | 8/2012 | Xia |
| 2012/0212849 A1 | 8/2012 | Xu |
| 2012/0236428 A1 | 9/2012 | Xia |
| 2012/0262814 A1 | 10/2012 | Li |
| 2012/0265488 A1 | 10/2012 | Sun |
| 2012/0317462 A1 | 12/2012 | Liu et al. |

(56) References Cited

U.S. PATENT DOCUMENTS

2013/0024740 A1 1/2013 Xia
2013/0031440 A1 1/2013 Sharon
2013/0120169 A1 5/2013 Li

OTHER PUBLICATIONS

Casado et al., Multiple-rate low-density parity-check codes with constant blocklength, IEEE Transations on communications, Jan. 2009, vol. 57, pp. 75-83.
Cui et al., "High-Throughput Layered LDPC Decoding Architecture", IEEE Transactions on Very Large Scale Integration (VLSI) Systems, vol. 17, No. 4 (Apr. 2009).
Fan et al., "Constrained coding techniques for soft iterative decoders" Proc. IEEE Global Telecommun. Conf., vol. 1b, pp. 631-637 (1999).
Fossorier, Marc P.C. "Quasi-Cyclic Low-Density Parity-Check Codes From Circulant Permutation Maricies" IEEE Transactions on Information Theory, vol. 50, No. 8 Aug. 8, 2004.
Gross, "Stochastic Decoding of LDPC Codes over GF(q)", HDPCC Workshop, Tel Aviv (Mar. 2, 2010).
Gunnam et al., "VLSI Architectures for Layered Decoding for Irregular LDPC Codes of WiMax", IEEE ICC Proceedings (2007).
Hagenauer, J. et al A Viterbi Algorithm with Soft-Decision Outputs and its Applications in Proc. IEEE Globecom, pp. 47. 11-47 Dallas, TX Nov. 1989.
Han and Ryan, "Pinning Techniques for Low-Floor Detection/Decoding of LDPC-Coded Partial Response Channels", 5th International Symposium on Turbo Codes &Related Topics, 2008.
Kautz, "Fibonacci Codes for Synchronization Control", IEEE Trans. Info. Theory, vol. 11, No. 2, pp. 284-292 (Apr. 1965).
Kschischang et al., "Factor Graphs and the Sum-Product Algorithm", IEEE Transactions on Information Theory, vol. 47, No. 2 (Feb. 2001).
Leduc-Primeau et al., "A Relaxed Half-Stochastic Iterative Decoder for LDPC Codes", IEEE Communications Society, IEEE Globecom proceedings (2009).
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Li et al "Efficient Encoding of Quasi-Cyclic Low-Density Parity Check Codes" IEEE Transactions on Communications on 53 (11) 1973-1973, 2005.
Lim et al. "Convergence Analysis of Constrained Joint Adaptation in Recording Channels" IEEE Trans. on Signal Processing vol. 54, No. 1 Jan. 2006.
Lin et al "An efficient VLSI Architecture for non binary LDPC decoders"—IEEE Transaction on Circuits and Systems II vol. 57, Issue 1 (Jan. 2010) pp. 51-55.
Moon et al, "Pattern-dependent noise prediction in signal-dependent Noise," IEEE JSAC, vol. 19, No. 4 pp. 730-743, Apr. 2001.
Moon et al., "Maximum transition run codes for data storage systems", IEEE Trans. Magn., vol. 32, No. 5, pp. 3992-3994 (Sep. 1996).
Patapoutian et al "Improving Re-Read Strategies by Waveform Averaging" IEEE Transactions on Mag. vol. 37 No. 6, Nov. 2001.
Shokrollahi "LDPC Codes: An Introduction", Digital Fountain, Inc. (Apr. 2, 2003).
Spagnol et al, "Hardware Implementation of GF(2m) LDPC Decoders", IEEE Transactions on Circuits and Systemsši: Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/296,022, filed Nov. 14, 2011, Victor Krachkovsky, Unpublished.
U.S. Appl. No. 13/227,544, filed Sep. 8, 2011, Shaohua Yang, Unpublished.
U.S. Appl. No. 13/239,683, filed Sep. 22, 2011, Changyou Xu, Unpublished.
U.S. Appl. No. 13/766,891, filed Feb. 14, 2013, Shu Li, Unpublished.
U.S. Appl. No. 13/213,751, filed Aug. 19, 2011, Fan Zhang, Unpublished.
U.S. Appl. No. 13/180,495, filed Jul. 11, 2011, Chung-Li Wang, Unpublished.
U.S. Appl. No. 13/300,078, filed Nov. 18, 2011, Chung-Li Wang, Unpublished.
U.S. Appl. No. 13/302,119, filed Nov. 22, 2011, Lei Chen, Unpublished.
U.S. Appl. No. 13/305,510, filed Nov. 28, 2011, Lei Chen, Unpublished.
U.S. Appl. No. 13/305,551, filed Nov. 28, 2011, Yang Han, Unpublished.
U.S. Appl. No. 13/174,537, filed Jun. 30, 2011, Anantha Raman Krishnan, Unpublished.
U.S. Appl. No. 13/174,453, filed Jun. 30, 2011, Johnson Yen, Unpublished.
U.S. Appl. No. 13/171,615, filed Jun. 29, 2011, Bradley D. Seago, Unpublished.
U.S. Appl. No. 13/113,219, filed May 23, 2011, Yang Han, Unpublished.
U.S. Appl. No. 13/269,832, filed Oct. 10, 2011, Haitao Xia, Unpublished.
U.S. Appl. No. 13/186,234, filed Jul. 19, 2011, Haitao Xia, Unpublished.
U.S. Appl. No. 13/227,416, filed Sep. 7, 2011, Lei Chen, Unpublished.
U.S. Appl. No. 13/989,583, filed Oct. 15, 2012, Shaohua Yang, Unpublished.
U.S. Appl. No. 13/596,819, filed Aug. 28, 2012, Shaohua Yang, Unpublished.
U.S. Appl. No. 13/596,947, filed Aug. 28, 2012, Fan Zhang, Unpublished.
U.S. Appl. No. 13/284,767, filed Oct. 28, 2011, Fan Zhang, Unpublished.
U.S. Appl. No. 13/597,001, filed Aug. 28, 2012, Fan Zhang, Unpublished.
U.S. Appl. No. 13/283,549, filed Oct. 27, 2011, Wu Chang, Unpublished.
U.S. Appl. No. 13/619,907, filed Sep. 14, 2012, Fan Zhang, Unpublished.
U.S. Appl. No. 13/621,341, filed Sep. 17, 2012, Shaohua Yang, Unpublished.
U.S. Appl. No. 13/545,833, filed Jul. 10, 2012, Zhi Bin Li, Unpublished.
U.S. Appl. No. 13/415,326, filed Mar. 8, 2012, Shaohua Yang, Unpublished.
U.S. Appl. No. 13/596,978, filed Aug. 28, 2012, Fan Zhang, Unpublished.
U.S. Appl. No. 13/483,100, filed May 30, 2012, Fan Zhang, Unpublished.
U.S. Appl. No. 13/483,105, filed May 30, 2012, Xuebin Wu, Unpublished.
U.S. Appl. No. 13/426,693, filed Mar. 22, 2012, Shaohua Yang, Unpublished.
U.S. Appl. No. 13/705,407, filed Dec. 5, 2012, Lingyan Sun, Unpublished.
U.S. Appl. No. 13/652,012, filed Oct. 15, 2012, Fan Zhang, Unpublished.
U.S. Appl. No. 13/746,301, filed Jan. 21, 2013, Shu Li, Unpublished.
U.S. Appl. No. 13/766,911, filed Feb. 14, 2013, Shaohua Yang, Unpublished.
U.S. Appl. No. 13/415,430, filed Mar. 8, 2012, Nayak Ratnakar Aravind, Unpublished.
U.S. Appl. No. 13/269,852, filed Oct. 10, 2011, Haitao Xia, Unpublished.
U.S. Appl. No. 13/316,858, filed Dec. 12, 2011, Zongwang Li, Unpublished.
U.S. Appl. No. 13/445,878, filed Apr. 12, 2012, Yu Liao, Unpublished.
U.S. Appl. No. 13/327,279, filed Dec. 15, 2011, Wei Feng, Unpublished.
U.S. Appl. No. 13/433,693, filed Mar. 29, 2012, Fan Zhang, Unpublished.

(56) References Cited

OTHER PUBLICATIONS

U.S. Appl. No. 13/340,974, filed Dec. 30, 2011, Dan Liu, Unpublished.
U.S. Appl. No. 13/445,848, filed Apr. 12, 2012, Bruce Wilson, Unpublished.
U.S. Appl. No. 13/316,741, filed Dec. 12, 2011, Yang Han, Unpublished.
U.S. Appl. No. 13/369,468, filed Feb. 9, 2012, Zongwang Li, Unpublished.
U.S. Appl. No. 13/362,409, filed Jan. 31, 2012, Fan Zhang, Unpublished.
U.S. Appl. No. 13/284,730, filed Oct. 28, 2011, Fan Zhang, Unpublished.
U.S. Appl. No. 13/412,520, filed Mar. 5, 2012, Fan Zhang, Unpublished.
U.S. Appl. No. 13/426,714, filed Mar. 22, 2012, Shaohua Yang, Unpublished.
U.S. Appl. No. 13/372,580, filed Feb. 14, 2012, Fan Zhang, Unpublished.
U.S. Appl. No. 13/422,986, filed Mar. 16, 2012, Fan Zhang, Unpublished.
U.S. Appl. No. 13/474,660, filed May 17, 2012, Zongwang Li, Unpublished.
U.S. Appl. No. 13/295,150, filed Nov. 14, 2011, Zongwang Li, Unpublished.
U.S. Appl. No. 13/340,951, filed Dec. 30, 2011, Lei Chen, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISSO6 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS FOR SKIP LAYER DATA DECODING

FIELD OF THE INVENTION

The present inventions are related to systems and methods for data processing, and more particularly to systems and methods for performing data decoding.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. In some cases, the corruption is localized resulting in potential waste of processing cycles, and possible re-corruption of otherwise non-corrupted portions.

Hence, for at least the aforementioned reasons, there exists a need in the art for advanced systems and methods for data decoding.

BRIEF SUMMARY

The present inventions are related to systems and methods for data processing, and more particularly to systems and methods for performing data decoding Various embodiments of the present invention provide data processing systems that include a data decoder circuit and a skip control circuit. The data decoder circuit is operable to apply a data decode algorithm to a decoder input to yield a decoded output. The decoder input includes at least a first portion and a second portion. The skip control circuit is operable to: determine a first status of the decoded output corresponding to the first portion and a second status of the decoded output corresponding to the second portion; and modify re-application of the data decode algorithm to the first portion by the data decoder circuit based at least in part on the first status.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
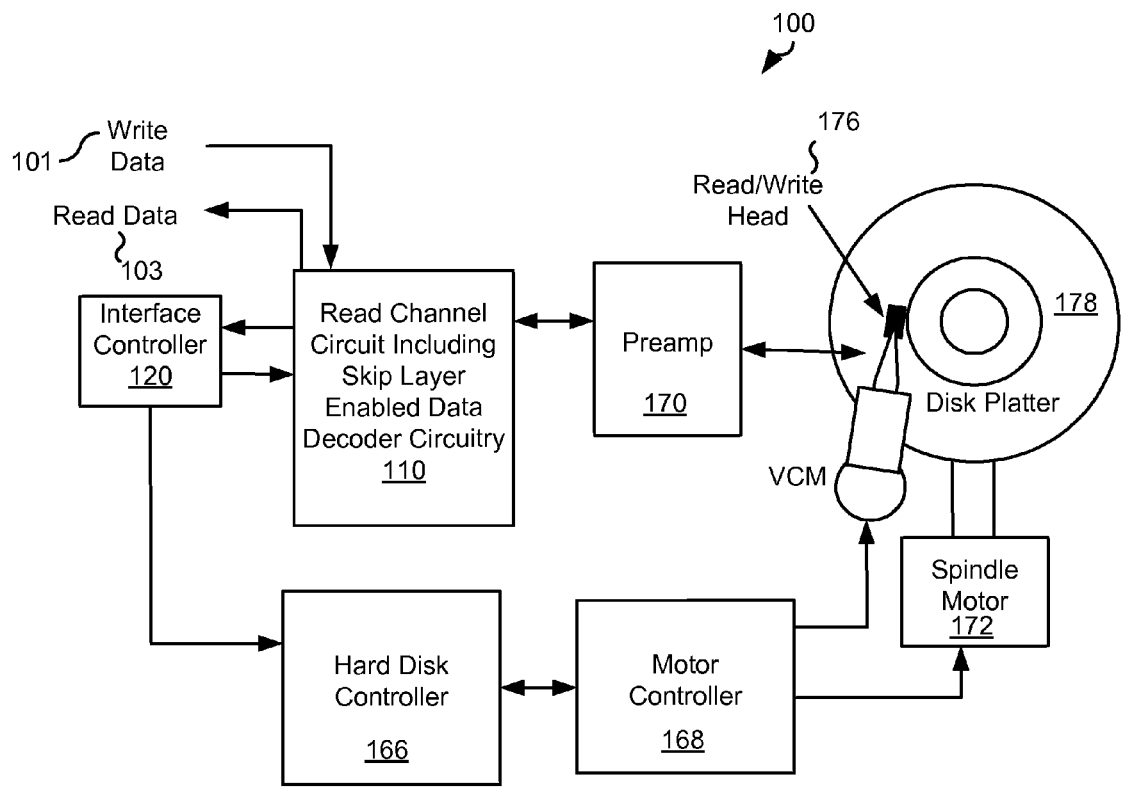
FIG. 1 shows a storage system including a read channel circuit having skip layer enabled data decoder circuitry in accordance with various embodiments of the present invention.

The present inventions are related to systems and methods for data processing, and more particularly to systems and methods for performing data decoding.

In some embodiments of the present invention a data processing system is disclosed that includes a data detector circuit and a data decoder circuit. The data detector circuit is operable to apply a data detection algorithm to a codeword to yield a detected output, and the data decoder circuit is operable to apply a data decode algorithm to a decoder input derived from the detected output to yield a decoded output. Processing a codeword through both the data detector circuit and the data decoder circuit is generally referred to as a "global iteration". During a global iteration, the data decode algorithm may be repeated applied. Each application of the data decode algorithm during a given global iteration is referred to as a "local iteration". In some embodiments of the present invention, application of the data decode algorithm includes generation of check node to variable node (c2v) messages and variable node to check node (v2c) messages as is known in the art.

The data decoder circuit includes an ability to disable processing of one or more subsets of a codeword. The disabling is done when the disabled subset does not include any remaining unsatisfied checks. Such disabling may yield different advantages depending upon the implementation including, but not limited to, stopping error propagation to otherwise corrected portions and saving of processing cycles and corresponding energy usage. Based upon the disclosure provided herein, one of ordinary skill in the art will recognize a variety of other advantages that may be achieved using one or more embodiments of the present invention. In some embodiments, the data decoder circuit is a layered data decoder circuit and the subsets of the codeword that may be disabled are respective layers processed by the layered data decoder circuit. Based upon the disclosure provided herein, one of ordinary skill in the art will recognize other codeword portions that may be subject to data decoder disabling in accordance with different embodiments of the present invention.

Various embodiments of the present invention provide data processing systems that include a data decoder circuit and a skip control circuit. The data decoder circuit is operable to apply a data decode algorithm to a decoder input to yield a decoded output. The decoder input includes at least a first portion and a second portion. The skip control circuit is operable to: determine a first status of the decoded output corresponding to the first portion and a second status of the decoded output corresponding to the second portion; and modify re-application of the data decode algorithm to the first portion by the data decoder circuit based at least in part on the first status.

In some instances of the aforementioned embodiments, modifying the re-application of the data decode algorithm to the first portion by the data decoder circuit based at least in part on the first status includes disabling the re-application of the data decode algorithm to the first portion. In various instances of the aforementioned embodiments, the data decoder circuit is a layered data decoder circuit, the first portion is a first layer of the codeword, and the second portion is a second layer of the codeword. In some cases, modifying the re-application of the data decode algorithm to the first layer by the data decoder circuit based at least in part on the first status includes disabling the re-application of the data decode algorithm to the first layer, and the messages associated with the first layer from a previous local iteration through the layered data decoder circuit are used in processing the second layer during a subsequent local iteration through the layered data decoder circuit. In various instances, the data decoder circuit is a low density parity check decoder circuit.

In particular instances of the aforementioned embodiments, the first status includes an indication that unsatisfied checks remaining after at least two consecutive local iterations applying the data decode algorithm by the data decoder circuit are the same. In some cases, the first status additionally indicates that the total number of unsatisfied checks from the decoded output corresponding to both the first portion and the second portion.

In some instances of the aforementioned embodiments, modifying the re-application of the data decode algorithm to the first portion by the data decoder circuit based at least in part on the first status includes scaling messages corresponding to the first portion by a disabling scalar value. The disabling scalar value is a value of 0.125 or less. In some instances of the aforementioned embodiments, the data processing system is implemented as an integrated circuit.

Other embodiments of the present invention provide data processing methods that include: receiving a codeword; applying a data detection algorithm to the codeword to yield a detected output; applying a data decode algorithm by a data decoder circuit to a first portion of a decoder input to yield a first decoded output where the decoder input is derived from the detected output; applying the data decode algorithm to a second portion of the decoder input to yield a second decoded output; generating a first status corresponding to the first decoded output; generating a second status corresponding to the second decoded output; based at least in part on the first status, modifying re-application of the data decode algorithm to the first portion by the data decoder circuit; and re-applying the data decode algorithm to the second portion of the decoder input using at least one message generated by applying the data decode algorithm by the data decoder circuit to the first portion of a decoder input.

Turning to FIG. 1, a storage system 100 including a read channel circuit 110 having skip layer enabled data decoder circuitry in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a data decoder circuit that includes an ability to disable decoding of one or more sections of a given codeword. When a potential trapping set is identified and additional local iterations through the data decoder circuit are allowed, application of the data decode algorithm to portions of a codeword that do not include any unsatisfied checks is disabled. In such a case, v2c messages and c2v messages generated during a previous local iteration of the particular portions not exhibiting unsatisfied checks are reused in the subsequent local iteration where processing of the particular portions is not enabled. Such an approach to data processing may yield different advantages including, but not limited to, stopping error propagation to otherwise corrected portions and saving of processing cycles and corresponding energy usage. Based upon the disclosure provided herein, one of ordinary skill in the art will recognize a variety of other advantages that may be achieved using one or more embodiments of the present invention. In some cases, read channel circuit 110 may be implemented to include a data processing circuit similar to that discussed below in relation to FIG. 3. The data processing circuit may include a layered decoder circuit including skip layer enable circuitry similar to that discussed below in relation to FIG. 4c or FIG. 4d. In one or more embodiments of the present invention, the data processing may be performed similar to that discussed below in relation to FIGS. 5a-5b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
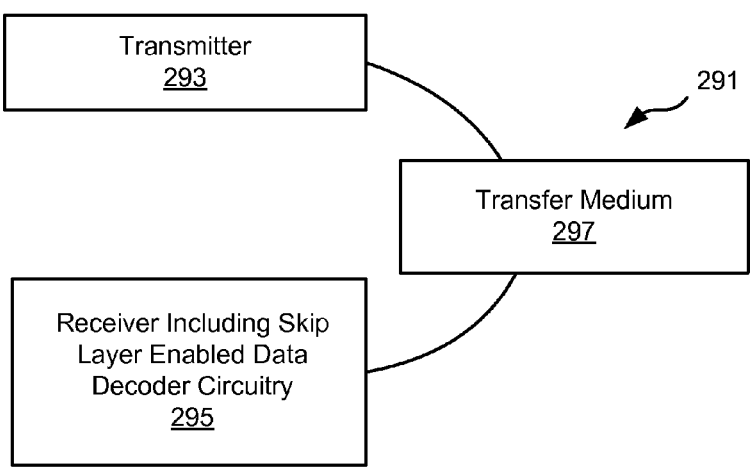
FIG. 2 depicts a data transmission system including a receiver having skip layer enabled data decoder circuitry in accordance with one or more embodiments of the present invention.

Turning to FIG. 2, a data transmission system 291 including a receiver 295 having skip layer enabled data decoder circuitry in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data.

As part of processing the received information, receiver 295 utilizes a data decoder circuit that includes an ability to disable decoding of one or more sections of a given codeword. When a potential trapping set is identified and additional local iterations through the data decoder circuit are allowed, application of the data decode algorithm to portions of a codeword that do not include any unsatisfied checks is disabled. In such a case, v2c messages and c2v messages generated during a previous local iteration of the particular portions not exhibiting unsatisfied checks are reused in the subsequent local iteration where processing of the particular portions is not enabled. Such an approach to data processing may yield different advantages including, but not limited to, stopping error propagation to otherwise corrected portions and saving of processing cycles and corresponding energy usage. Based upon the disclosure provided herein, one of ordinary skill in the art will recognize a variety of other advantages that may be achieved using one or more embodiments of the present invention. In some cases, receiver 295 may be implemented to include a data processing circuit similar to that discussed below in relation to FIG. 3. The data processing circuit may include a layered decoder circuit including skip layer enable circuitry similar to that discussed below in relation to FIG. 4c or FIG. 4d. In one or more embodiments of the present invention, the data processing may be performed similar to that discussed below in relation to FIGS. 5a-5b.

Figure 3:
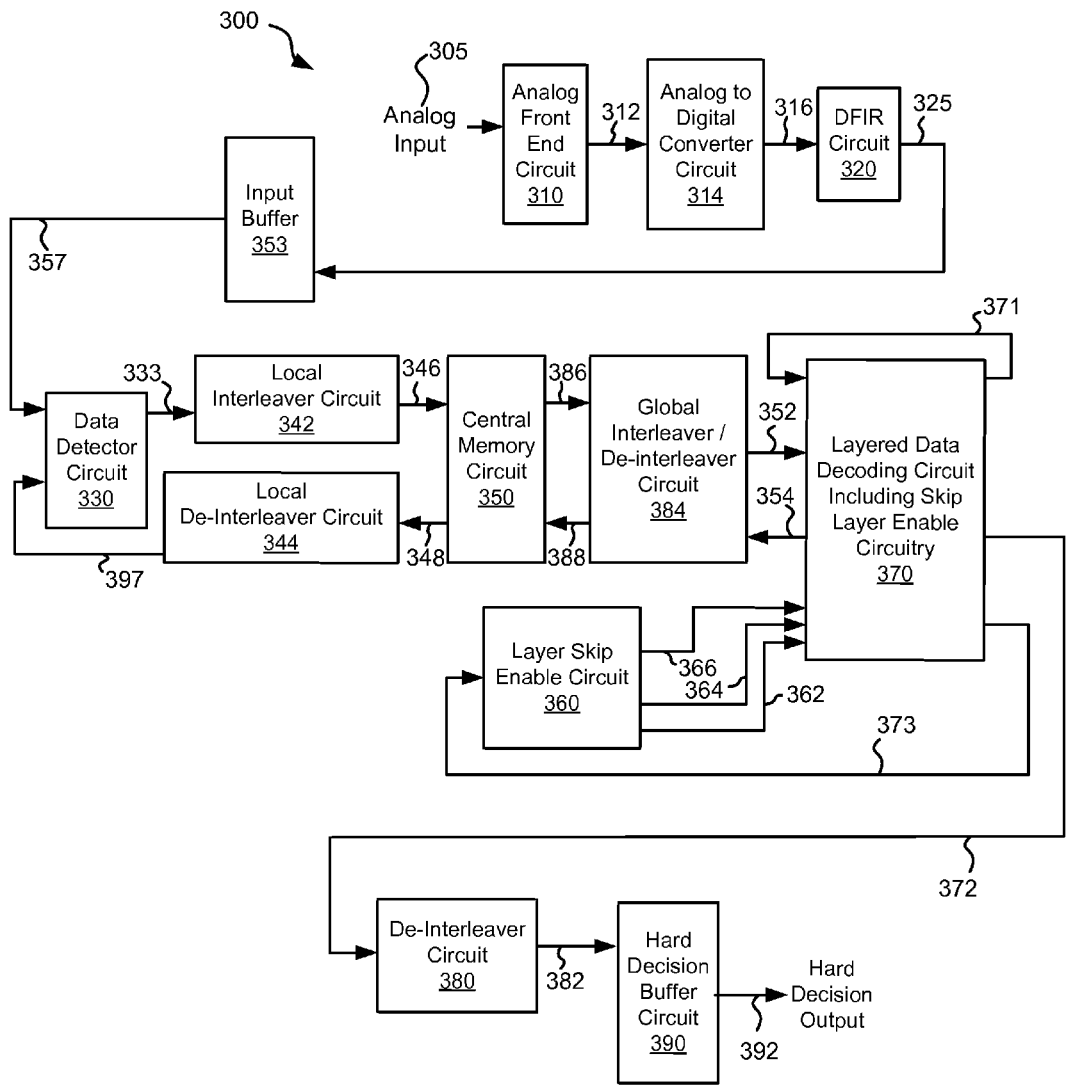
FIG. 3 shows a data processing circuit including a layered data decoder circuit having skip layer enabled data decoder circuitry in accordance with some embodiments of the present invention.

Turning to FIG. 3, a data processing circuit 300 including a layered data decoding circuit 370 having skip layer enabled data decoder circuitry is shown in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and a layered data decoding circuit 370 including, where warranted, multiple global iterations (passes through both data detector circuit 330 and layered data decoding circuit 370) and/or local iterations (passes through layered data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once layered data decoding circuit 370 is available, a previously stored interleaved codeword 346 is accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 into layered data decoding circuit. In some embodiments of the present invention, the data decode algorithm is a layered low density parity check algorithm as are known in the art. Layered data decoding circuit 370 applies a data decoding algorithm to decoder input 352 to yield a decoded output 371. In cases where another local iteration (i.e., another pass trough data decoder circuit 370) is desired or allowed, layered data decoding circuit 370 re-applies the data decode algorithm to decoder input 352 guided by decoded output 371. This continues until either a maximum number of local iterations is exceeded or decoded output 371 converges (i.e., completion of standard processing).

During such application of the data decode algorithm by layered data decoding circuit 370 over multiple local iterations, the same errors may recur. A result 373 of the local iteration of layered data decoding circuit 370 including an indication of errors is provided to a layer skip enable circuit 360. Where the data decode algorithm is a low density parity check algorithm, the errors may be failure to satisfy one or more parity check equations. Errors, including, but not limited to, failure to satisfy a parity check equations, may be referred to herein as "unsatisfied checks".

Layer skip enable circuit 360 analyzes the errors reported as part of result 360 to determine whether the same errors are recurring through multiple local iterations. The recurrence of the same errors in addition to the overall number of errors being less than a threshold may indicate a difficult to correct error that may be referred to as a potential "trapping set". Where a potential trapping set is identified layer skip enable circuit 360 determines whether any of the layers of decoder input 352 are error free. Where a layer is identified as error free, an enable output (one of enable outputs 362, 364, 366) is asserted causing messaging (e.g., c2v and v2c messages) associated with the error free layer to be disabled. In the depicted embodiment, layered data decoding circuit processes decoder input 352 in three layers with each of the three layers being associated with a respective one of enable outputs 362, 364, 366. Based upon the disclosure provided herein, one of ordinary skill in the art will recognize other numbers of layers that may be used in relation to different embodiments of the present invention.

Disabling the messaging associated with a layer may be done in one of a number of ways. For example, in some embodiments of the present invention, the messaging is disabled by scaling any messages resulting from applying the data decode algorithm to the particular layer with a low value scalar (e.g., a scalar of 0.125 or less). This renders the effect of any message from the disabled layer on other layers minimal. Such disabling may yield different advantages including, but not limited to, stopping error propagation to otherwise corrected layers. As another example, in some embodiments of the present invention, the messaging is disabled by disabling application of the data decode algorithm to the disabled layer altogether. This results in retaining the messaging developed during application of the data decode algorithm to the disabled layer for a preceding local iteration, and thus avoids modification of the messaging for the disabled layer. These retained messages may then be used when other, non-disabled layers are re-processed during a subsequent local iteration. Such disabling may yield different advantages depending upon the implementation including, but not limited to, stopping error propagation to otherwise corrected layers and saving of processing cycles and corresponding energy usage. Based upon the disclosure provided herein, one of ordinary skill in the art will recognize a variety of other advantages that may be achieved using one or more embodiments of the present invention.

Where decoded output 371 fails to converge (i.e., fails to yield the originally written data set) and a number of local iterations through layered data decoding circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380 that rearranges the data to reverse both the global and local interleaving applied to the data to yield a de-interleaved output 382. De-interleaved output 382 is provided to a hard decision buffer circuit 390 that arranges the received codeword along with other previously received codewords in an order expected by a requesting host processor. The resulting output is provided as a hard decision output 392.

Figure 4A:
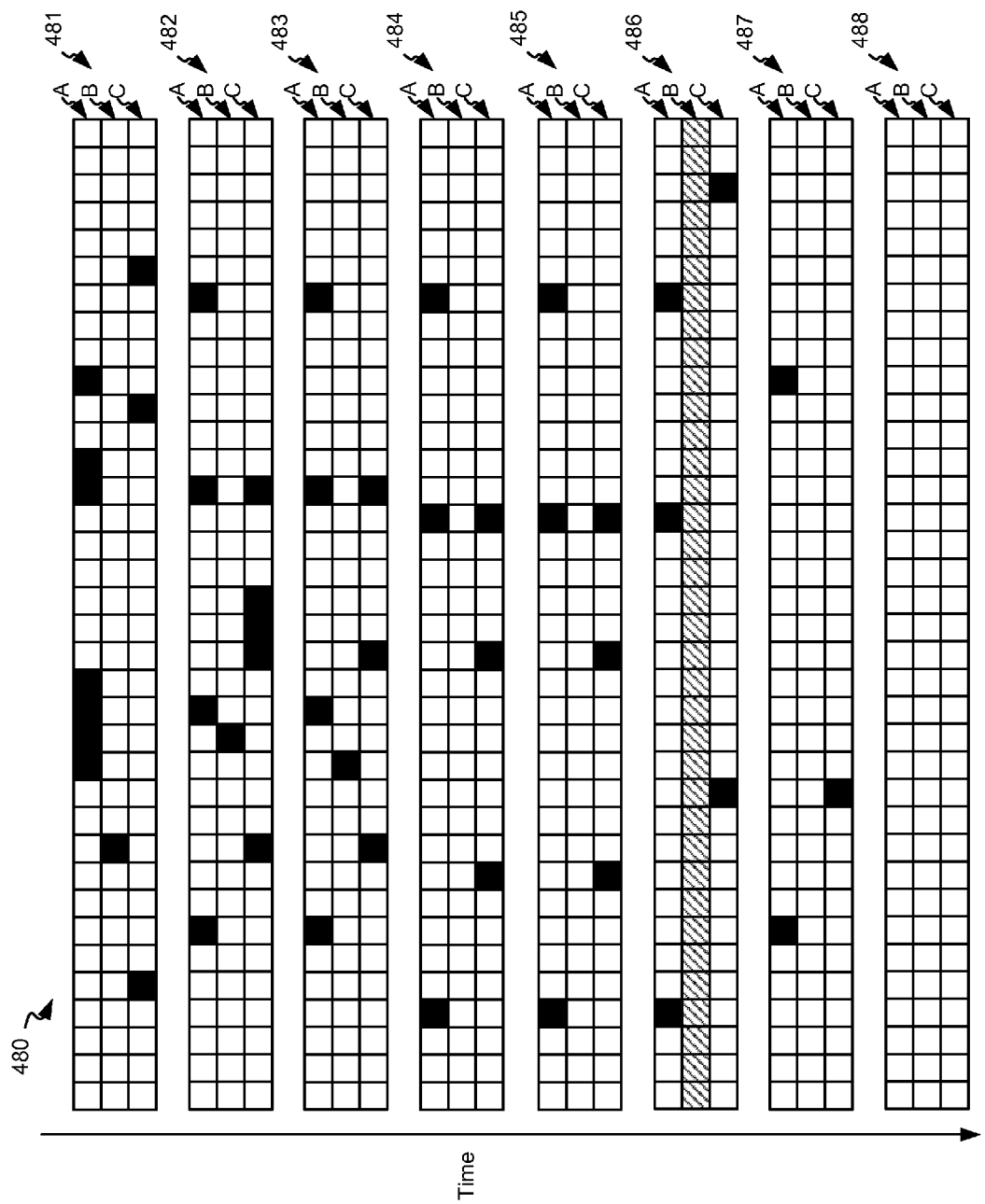
FIG. 4a graphically represents a process of layer skipping in application of a data decode algorithm in accordance with various embodiments of the present invention.

Turning to FIG. 4a, a graphical representation 480 of an example of a number of consecutive local iterations 481, 482, 483, 484, 485, 486, 487, 488 applying the data decode algorithm to a codeword by data decoding circuit 370 is shown. As shown, the parity check matrix used by the processing codeword is divided into three layers each with twenty-eight (28) circulants. The circulants are represented by square boxes, and each of the three layers of circulants are labeled as A, B, C, respectively. In processing the layers, data decoding circuit 370 updates messages (c2v messages and v2c messages) in a defined order. In this case, data decoding circuit 370 processes layer A first by updating messages in this layer, followed by layer B and then layer C updating messages in each of the respective layers in order. Further, the data is processed from left to right updating messages from each circulant (represented by a square) in order. At the end, the messages from all of the layers are combined.

At the end of each local iteration (481, 482, 483, 484, 485, 486, 487, 488) it is determined whether application of the data decode algorithm resulted in the original data set (i.e., convergence). The original data set is considered found when no unsatisfied checks or other errors remain. As shown in FIG. 4a, the occurrence of one or more unsatisfied checks in relation to a given circulant at the end of processing is represented by a black fill in the square representing the particular circulant.

As shown in graphical representation 480, the number of remaining unsatisfied checks is reduced through the first four local iterations 481, 482, 483, 484, and the location of the errors change somewhat between each local iteration. However, between local iteration 484 and local iteration 485 the number and location of the errors remains the same. This is an indication of a potential trapping set. In particular, a potential trapping set is indicated where the total number of unsatisfied checks is below a threshold value and the unsatisfied checks remain in the same locations for a defined number of local iterations. In this case, the threshold value is ten (10) unsatisfied checks and the defined number of local iterations is one (1). Based upon the disclosure provided herein, one of ordinary skill in the art will recognize a variety of different values for threshold value and the defined number of local iterations that may be used in accordance with different embodiments of the present invention. Of note, other indicators of a potential trapping set may be used in relation to different embodiments of the present invention.

Where a potential trapping set is identified, processing of any layer (i.e., layers A, B, C) that does not exhibit any unsatisfied checks is disabled on the subsequent local iteration. In this case, layer B does not exhibit any unsatisfied checks at the end of local iteration 485 when the potential trapping set is identified. In such a case, processing of layer B of the codeword is disabled for the subsequent local iteration 486. Disabling of the processing of layer B is indicate by the cross hatching shown in graphical representation 480 and is performed by asserting one of enable outputs 362, 364, 366 corresponding to layer B. After this, processing is returned to normal for the remaining local iterations 487, 488. As shown, after local iteration 488, no unsatisfied checks remain and the codeword is considered to have converged.

Disabling processing of any layer may be done in one of a number of ways. For example, in some embodiments of the present invention, application of the data decode algorithm to the disabled layer may be performed, but the messaging (c2v messages and v2c messages) resulting from the layer may be scaled by a low value scalar (e.g., a scalar of 0.125 or less). This renders the effect of any message from the disabled layer on other layers minimal. Such disabling may yield different advantages including, but not limited to, stopping error propagation to otherwise corrected layers. As another example, in some embodiments of the present invention, disabling processing of a given layer may involve disabling application of the data decode algorithm to the disabled layer altogether. This results in retaining the messaging developed during application of the data decode algorithm to the disabled layer for a preceding local iteration, and thus avoids modification of the messaging for the disabled layer. These retained messages may then be used when other, non-disabled layers are re-processed during a subsequent local iteration. Such disabling may yield different advantages depending upon the implementation including, but not limited to, stopping error propagation to otherwise corrected layers and saving of processing cycles and corresponding energy usage. Based upon the disclosure provided herein, one of ordinary skill in the art will recognize a variety of other advantages that may be achieved using one or more embodiments of the present invention.

Where, in contrast to that shown in graphical representation 480, local iteration 488 had not converged, another local iteration by data decoding circuit 370 may be applied where the maximum allowable number of local iterations had not yet been exceeded. Alternatively, where local iteration 488 was the last allowable local iteration, the result after local iteration 488 is returned to central memory 350 to await the next global iteration. During application of the data decode algorithm by data decoding circuit 370 the next global iteration, all layers are initially enabled. Disabling of one or more layers occurs only after a potential trapping set is again identified in the next global iteration.

In other embodiments of the present invention, once processing for a particular layer is disabled, it remains disabled for all remaining local iterations during a given global iteration. Graphically representing such an embodiment would show cross hatching on layer B of both local iteration 487 and local iteration 488. Again, where local iteration 488 of graphical representation had not converged, another local iteration by data decoding circuit 370 may be applied where the maximum allowable number of local iterations had not yet been exceeded. Alternatively, where local iteration 488 was the last allowable local iteration, the result after local iteration 488 is returned to central memory 350 to await the next global iteration. During application of the data decode algorithm by data decoding circuit 370 the next global iteration, all layers are initially enabled. Disabling of one or more layers occurs only after a potential trapping set is again identified in the next global iteration.

Figure 4B:
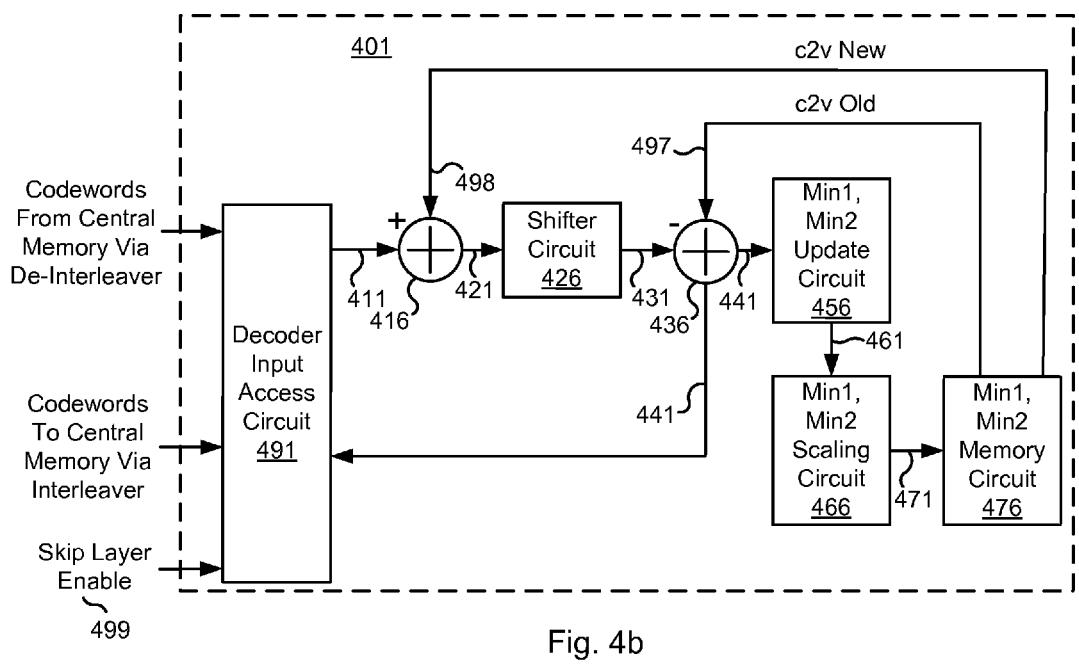
FIGS. 4b-4c show two implementations of a data decoder circuit including skip layer enabled circuitry that may be used in relation to different embodiments of the present invention.

Turning to FIG. 4b, a layered data decoder circuit 401 including skip layer enabled circuitry that may be used in relation to different embodiments of the present invention is shown. Layered data decoder circuit 401 may be used in place of data decoding circuit 370 of FIG. 3. Layered data decoder circuit 401 includes a decoder input access circuit 491 that accesses a next layer of a codeword from central memory circuit 350 via de-interleaver circuit 384. Decoder input access circuit 491 provides the selected layer to be provided as a selected codeword (i.e., a circulant of a selected codeword) 411 to a summation circuit 416 where it is added to a new c2v message 498 to yield a first sum 421. First sum 421 is provided to a shifter circuit 426 that is operable to rotate a quasi cyclic input to yield a shifted output 431. Shifter circuit 426 may be any circuit known in the art that is capable of shifting codewords including quasi-cyclic circulants. Shifted output 431 is provided to a summation circuit 436 where an old c2v message 497 is subtracted therefrom to yield a second sum 441. Second sum 441 is provided back to the central memory 350 as codewords via decoder input access circuit 491. This replaces the previous instance of codewords for the currently processing codeword.

In addition, second sum 441 is provided to a min 1, min 2 update circuit 456. Min 1, min 2 update circuit 456 selects the minimum distance (i.e., min 1) and the next minimum distance (i.e., min 2) to the next trellis node. Min 1, min 2 update circuit 456 may be any circuit known in the art for generating the first and second minimum distance values. Based upon the disclosure provided herein, one of ordinary skill in the art will recognize a variety of implementations of min 1, min 2 update circuit 456 that may be used in relation to different embodiments of the present invention.

Min 1, min 2 update circuit 456 provides the generated min 1 and min 2 values as an output 461 to a min 1, min 2 scaling circuit 466. Min 1, min 2 scaling circuit 466 scales output 461 to yield scaled mini, min 2 values 471 that are provided to a min 1, min 2 memory circuit 476. Min 1, min 2 scaling circuit 466 may be any circuit known in the art that is capable of applying a scalar to a received value to yield a scaled value. In one particular embodiment of the present invention, min 1, min 2 scaling circuit 466 is a multiplier circuit. Min 1, min 2 memory circuit 476 retains a previous instances of scaled min 1, min 2 values 471 as c2v old message 497, and the current instance of scaled min 1, min 2 values 476 as c2v new message 498. The storage of min 1, min 2 memory circuit 476 is updated.

As shown, a skip layer enable signal 499 is provided to decoder input access circuit 491. Skip layer enable signal 499 is a combination of enable outputs 362, 364, 366 and causes decoder input access circuit 491 to skip a given layer (i.e., start accessing data from a subsequent layer), when a respective one of enable outputs 362, 364, 366 is asserted. As such, layered data decoder circuit 401 does not process any layer associated with a respective asserted enable output 362, 364, 366. As such, error propagation to otherwise corrected portions is stopped, and processing cycles and corresponding energy usage is saved.

Figure 4C:
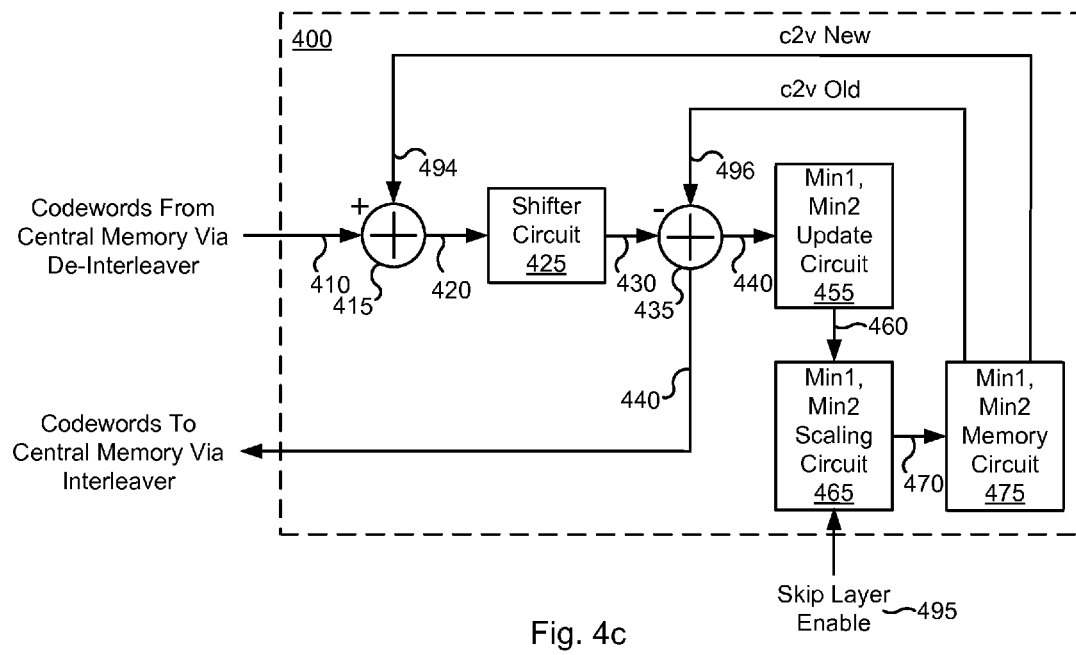

Turning to FIG. 4c, a layered data decoder circuit 400 including skip layer enabled circuitry that may be used in relation to different embodiments of the present invention is shown. Layered data decoder circuit 400 may be used in place of data decoding circuit 370 of FIG. 3. Layered data decoder circuit 400 includes a summation circuit 415 that adds a selected codeword (i.e., a circulant of a selected codeword) 410 to a new c2v message 494 to yield a first sum 420. First sum 420 is provided to a shifter circuit 425 that is operable to rotate a quasi cyclic input to yield a shifted output 430. Shifter circuit 425 may be any circuit known in the art that is capable of shifting codewords including quasi-cyclic circulants. Shifted output 430 is provided to a summation circuit 435 where an old c2v message 496 is subtracted therefrom to yield a second sum 440. Second sum 440 is provided back to the central memory 350 as codewords via interleaver circuit 384. This replaces the previous instance of codewords for the currently processing codeword.

In addition, second sum 440 is provided to a min 1, min 2 update circuit 455. Min 1, min 2 update circuit 455 selects the minimum distance (i.e., min 1) and the next minimum distance (i.e., min 2) to the next trellis node. Min 1, min 2 update circuit 455 may be any circuit known in the art for generating the first and second minimum distance values. Based upon the disclosure provided herein, one of ordinary skill in the art will recognize a variety of implementations of min 1, min 2 update circuit 455 that may be used in relation to different embodiments of the present invention.

Min 1, min 2 update circuit 455 provides the generated min 1 and min 2 values as an output 460 to a min 1, min 2 scaling circuit 465. Min 1, min 2 scaling circuit 465 scales output 460 to yield scaled mini, min 2 values 470 that are provided to a min 1, min 2 memory circuit 475. Min 1, min 2 scaling circuit 465 may be any circuit known in the art that is capable of applying a scalar to a received value to yield a scaled value. In one particular embodiment of the present invention, min 1, min 2 scaling circuit 465 is a multiplier circuit. Min 1, min 2 memory circuit 475 retains a previous instances of scaled min 1, min 2 values 470 as c2v old message 496, and the current instance of scaled min 1, min 2 values 475 as c2v new message 494. The storage of min 1, min 2 memory circuit 475 is updated.

As shown, a skip layer enable signal 495 is provided to min 1, min 2 scaling circuit 465 and causes the scaling value applied by min 1, min 2 scaling circuit 465 to be the lowest possible scaling value. Skip layer enable signal 495 is a combination of enable outputs 362, 364, 366 and causes decoder input access circuit 491 to skip a given layer (i.e., start accessing data from a subsequent layer), when a respective one of enable outputs 362, 364, 366 is asserted. In some cases, this scaling value is zero. In various cases, the scaling value is 0.125 or less. Based upon the disclosure provided herein, one of ordinary skill in the art will recognize a variety of values of the scalar that may be applied by min 1, min 2 scaling circuit 465 to reduce the impact of processing a selected layer. As such, error propagation to otherwise corrected portions is stopped.

Figure 5A:
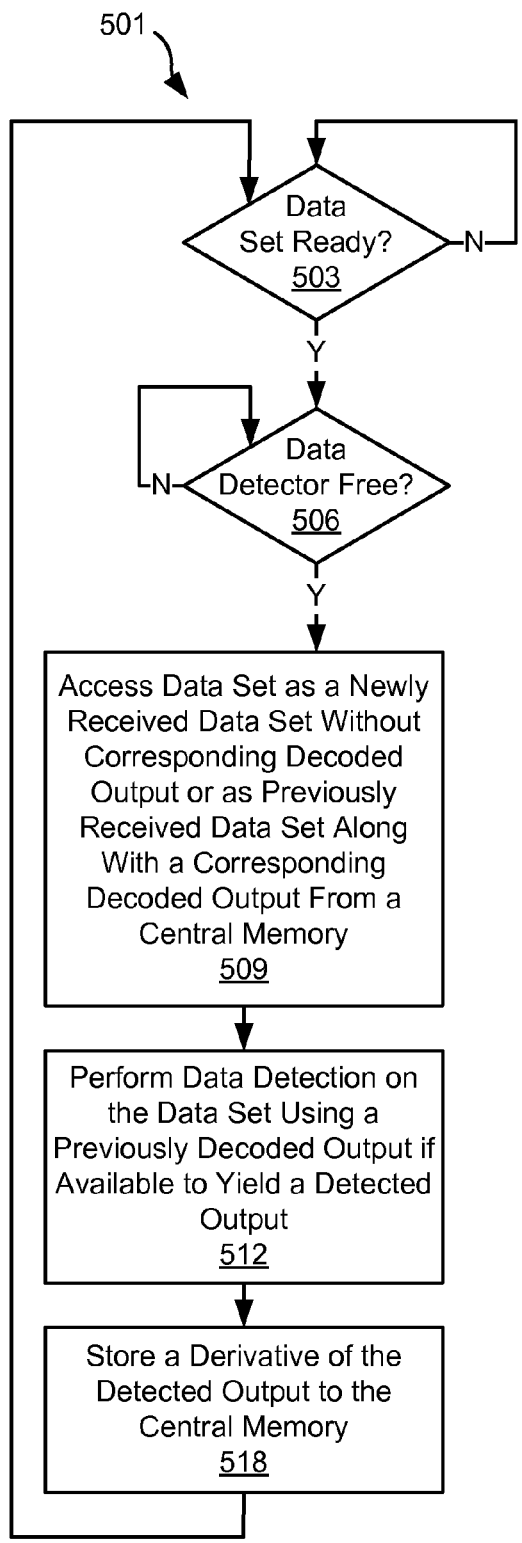
FIGS. 5a-5b are flow diagrams showing a method for performing data processing including application of a data decode algorithm capable of skipping in accordance with one or more embodiments of the present invention.
Figure 5B:
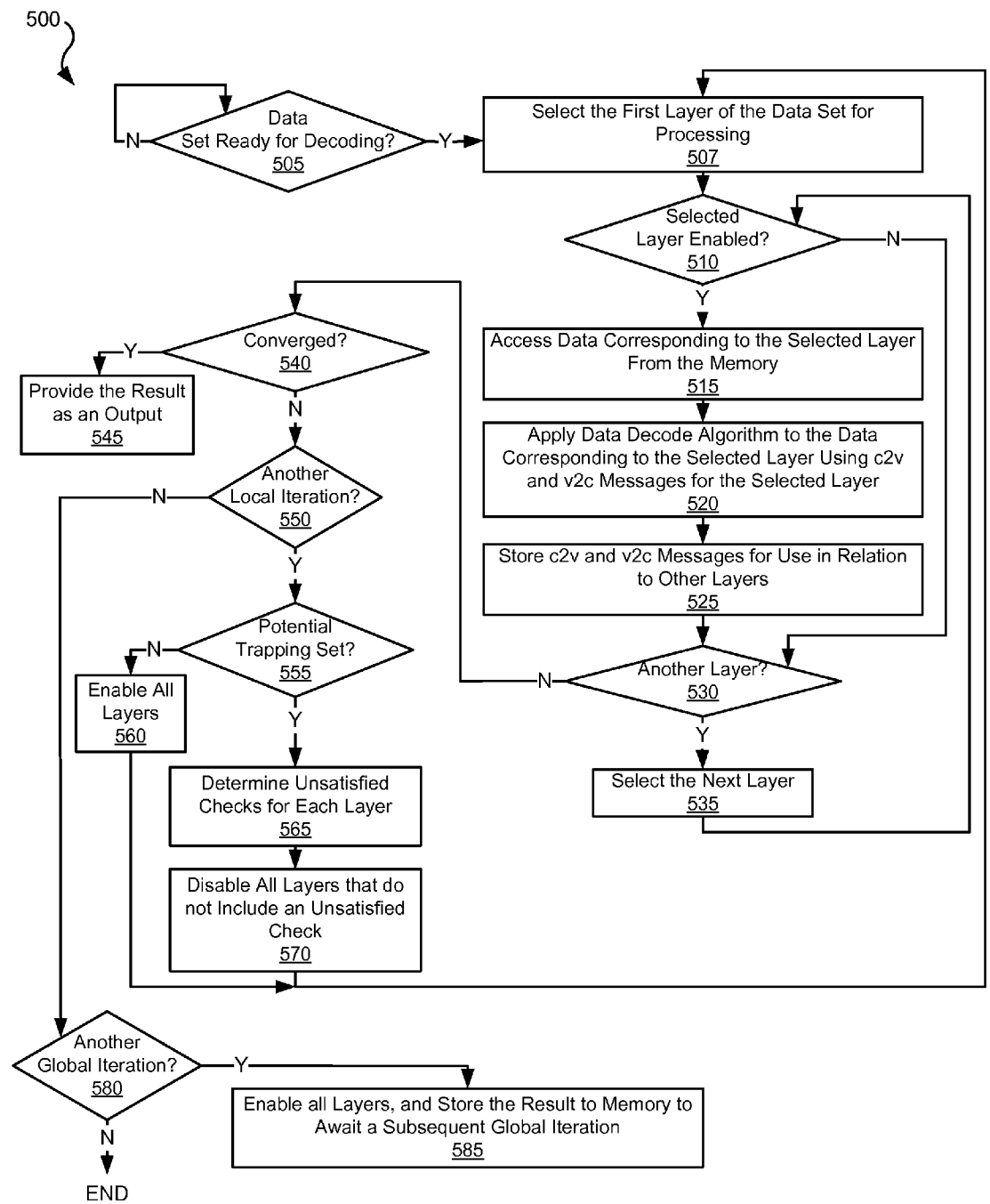

Turning to FIGS. 5a-5b, flow diagrams 500, 501 show a method for performing data processing including application of a data decode algorithm capable of skipping in accordance with one or more embodiments of the present invention. Following flow diagram 501 of FIG. 5a, it is determined whether a data set or codeword is ready for application of a data detection algorithm (block 503). In some cases, a data set is ready when it is received from a data decoder circuit via a central memory circuit. In other cases, a data set is ready for processing when it is first made available from a front end processing circuit. Where a data set is ready (block 503), it is determined whether a data detector circuit is available to process the data set (block 506).

Where the data detector circuit is available for processing (block 506), the data set is accessed by the available data detector circuit (block 509). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 512). Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 518). The derivative of the detected output may be, for example, an interleaved or shuffled version of the detected output.

Turning to FIG. 5b and following flow diagram 500, it is determined whether a data set or codeword is ready for processing by a data decoder circuit (block 505). A data set may become available after processing through an upstream data detector circuit has completed. Where a data set is available for processing (block 505), a first layer of the data set is selected for processing (block 507). This access from memory may include interleaving or de-interleaving depending upon the status of the available data set. It is then determined whether the selected layer is enabled (block 510). The determination of enabling or disabling the layer is discussed in more detail below.

Where the selected layer is enabled for processing (block 510), data corresponding to the selected layer is accessed from the central memory (block 515). A data decode algorithm is then applied to the data corresponding to the selected layer using v2c and c2v messages corresponding to the layer (block 520). This application of the data decode algorithm results in updating of c2v messages and v2c messages. These updated c2v messages and v2c messages are stored for use in relation to other layers (block 525). It is then determined whether another layer of the currently processing codeword remains to be processed (block 530). Where another layer remains to be processed (block 530), the next layer of the currently processing codeword is selected (block 535), and the processes of block 510-530 are repeated for the newly selected codeword. Alternatively, where the selected layer is not enabled (block 510), the processes of block 530 is performed without processing the previously selected layer.

Where, on the other hand, no additional layers of the codeword remain to be processed during the current local iteration (block 530), it is determined whether the previous local iteration converged (i.e., generated the desired result) (block 540) or a time out condition (e.g., exceeding a number of allowed local iterations) occurred (block 550). Where the data decoding converged (block 540), the converged result is provided as an output (block 545), and processing of the current codeword ends. Otherwise, where the data decoding failed to converge (block 540), it is determined whether another local iteration is allowed (block 550). In some cases, seven (7) to ten (10) local iterations are allowed during each global iteration. Based upon the disclosure provided herein, one of ordinary skill in the art will recognize a variety of numbers of allowable local iterations that may be used in relation to different embodiments of the present invention.

Where another local iteration is allowed (block 550), it is determined whether a potential trapping set exists (block 555). In one embodiment of the present invention, a potential trapping set is identified where the overall number of errors remaining after the last local iterations is less than a threshold and the same errors (e.g., the same parity check equations fail) recur for a defined number of local iterations. In some embodiments of the present invention, the defined number of local iterations is two (2) and the threshold is ten (10). Based upon the disclosure provided herein, one of ordinary skill in the art will recognize a variety of different values for the defined number of local iterations and the threshold that may be used in relation to other embodiments of the present invention.

Where a potential trapping set is not identified (block 555), all layers of the codeword are enabled for the subsequent local iteration of the codeword (block 560). This enabling of the layers is used for the determination discussed above in relation to block 510. Alternatively, where a potential trapping set is identified (block 555), the remaining unsatisfied checks or other errors are determined on a layer by layer basis (block 565), and all layers that do not exhibit any remaining unsatisfied checks or other errors are disabled (block 570). This disabling of error free layers is used for the determination discussed above in relation to block 510. At this juncture, the next local iteration of the codeword is started and the processes of blocks 507-670 are repeated.

Where another local iteration is not allowed for the particular codeword (block 550), it is determined whether another global iteration is allowed for the codeword (block 580). Where another global iteration is not allowed (block 580), the process ends. Alternatively, where another global iteration is allowed (block 580), all layers are enabled for the next global iteration, and the result of the previous local iteration is stored to memory to await a subsequent global iteration (block 585).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data decoder circuit operable to apply a data decode algorithm to a decoder input to yield a decoded output, wherein the decoder input includes at least a first portion, a second portion, and a third portion; and
    a skip control circuit operable to:
        determine a first number of unsatisfied checks specific to the first portion;
        determine a second number of unsatisfied checks specific to the second portion;
        skip re-application of the data decode algorithm to the first portion where at least the first number of unsatisfied checks is zero; and
        skip re-application of the data decode algorithm to the second portion where at least the second number of unsatisfied checks is zero.

2. The data processing system of claim 1, wherein the skip control circuit is further operable to:
    skip re-application of the data decode algorithm to the first portion where both the first number of unsatisfied checks is zero and a potential trapping set is identified; and
    skip re-application of the data decode algorithm to the second portion where both the second number of unsatisfied checks is zero and a potential trapping set is identified.

3. The data processing system of claim 1, wherein the skip control circuit is further operable to:
    skip re-application of the data decode algorithm to the first portion where both the first number of unsatisfied checks is zero and at least two consecutive local iterations applying the data decode algorithm by the data decoder circuit yield the same number of unsatisfied checks; and
    skip re-application of the data decode algorithm to the second portion where both the second number of unsatisfied checks is zero and at least two consecutive local iterations applying the data decode algorithm by the data decoder circuit yield the same number of unsatisfied checks.

4. The data processing system of claim 3, wherein the same number of unsatisfied checks is the same total number of unsatisfied checks including the aggregate of the first number of unsatisfied checks, and the second number of unsatisfied checks.

5. The data processing system of claim 1, wherein the data decoder circuit is a layered data decoder circuit, wherein the first portion is a first layer of the codeword, and wherein the second portion is a second layer of the codeword.

6. The data processing system of claim 5, wherein when the first layer is skipped, messages associated with the first layer from a previous local iteration through the layered data decoder circuit are used in processing the second layer during a subsequent local iteration through the layered data decoder circuit.

7. The data processing system of claim 1, wherein skipping the re-application of the data decode algorithm to the first portion by the data decoder circuit includes scaling messages corresponding to the first portion by a disabling scalar value.

8. The data processing system of claim 1, wherein the data decoder circuit is a low density parity check decoder circuit.

9. The data processing system of claim 1, wherein the data processing system further comprises:
    a data detector circuit operable to apply a data detection algorithm to a data input to yield a detected output, wherein the decoder input is derived from the detected output.

10. The data processing system of claim 9, wherein the data detector circuit is selected from a group consisting of: a Viterbi algorithm data detector circuit, and a maximum a posteriori data detector circuit.

11. The data processing system of claim 1, wherein the data processing system is implemented as an integrated circuit.

12. The data processing system of claim 1, wherein the data processing system is incorporated in a device selected from a group consisting of: a storage device, and a data transmission device.

13. A data processing method, the data processing method comprising:
    receiving a codeword;
    applying a data detection algorithm to the codeword to yield a detected output;
    applying a data decode algorithm by a data decoder circuit to a first portion of a decoder input to yield a first decoded output, wherein the decoder input is derived from the detected output;
    applying the data decode algorithm to a second portion of the decoder input to yield a second decoded output;
    generating a first number of unsatisfied checks corresponding to the first decoded output;
    generating a second number of unsatisfied checks corresponding to the second decoded output;
    based at least in part on the first number of unsatisfied checks being equal to zero, modifying re-application of the data decode algorithm to the first portion by the data decoder circuit; and
    re-applying the data decode algorithm to the second portion of the decoder input using at least one message generated by applying the data decode algorithm by the data decoder circuit to the first portion of a decoder input.

14. The method of claim 13, wherein modifying re-application of the data decode algorithm to the first portion by the data decoder circuit includes disabling the re-application of the data decode algorithm to the first portion.

15. The method of claim 13, wherein the data decoder circuit is a layered data decoder circuit, wherein the first portion is a first layer of the codeword, and wherein the second portion is a second layer of the codeword.

16. The method of claim 13, wherein modifying the re-application of the data decode algorithm to the first portion by the data decoder circuit includes scaling messages corresponding to the first portion by a disabling scalar value.

17. The method of claim 13, wherein modifying re-application of the data decode algorithm to the first portion by the data decoder circuit occurs only after at least two consecutive local iterations applying the data decode algorithm to both the first portion and the second portion are the same.

18. A storage device, the storage device comprising:
    a storage medium;
    a head assembly disposed in relation to the storage medium and operable to provide a sensed signal corresponding to a data set on the storage;
    a read channel circuit including:
        an analog front end circuit operable to provide an analog signal corresponding to the sensed signal;
        an analog to digital converter circuit operable to sample the analog signal to yield a series of digital samples;

an equalizer circuit operable to equalize the digital samples to yield a sample set;

a data decoder circuit operable to apply a data decode algorithm to a decoder input to yield a decoded output, wherein the decoder input is derived from the sample set and includes at least a first portion and a second portion; and a skip control circuit operable to:
  determine a first number of unsatisfied checks specific to the first portion;
  determine a second number of unsatisfied checks specific to the second portion;
  disable re-application of the data decode algorithm to the first portion where at least the first number of unsatisfied checks is zero; and
  disable re-application of the data decode algorithm to the second portion where at least the second number of unsatisfied checks is zero.

\* \* \* \* \*